United States Patent
Hoffmann et al.

(10) Patent No.: US 6,806,550 B2
(45) Date of Patent: Oct. 19, 2004

(54) EVALUATION CONFIGURATION FOR SEMICONDUCTOR MEMORIES

(75) Inventors: Kurt Hoffmann, Taufkirchen (DE); Oskar Kowarik, Neubiberg (DE)

(73) Assignee: Infineon Technologies AG, Munich (DE)

(*) Notice: Subject to any disclaimer, the term of this patent is extended or adjusted under 35 U.S.C. 154(b) by 201 days.

(21) Appl. No.: 10/244,258

(22) Filed: Sep. 16, 2002

(65) Prior Publication Data

US 2003/0052344 A1 Mar. 20, 2003

(30) Foreign Application Priority Data

Sep. 14, 2001 (DE) .......................... 101 45 556

(51) Int. Cl.⁷ ............................................. H01L 29/00
(52) U.S. Cl. ...................... 257/526; 257/370; 257/378; 257/401; 257/499; 257/517; 257/565
(58) Field of Search ................................ 257/565, 370, 257/378, 526, 517, 499, 401; 365/51, 63, 185.07, 205

(56) References Cited

U.S. PATENT DOCUMENTS

| | | | | |
|---|---|---|---|---|
| 4,984,196 A | * | 1/1991 | Tran et al. ...................... 365/51 |
| 5,046,050 A | * | 9/1991 | Kertis ......................... 365/208 |
| 5,138,201 A | * | 8/1992 | Ohbayashi et al. ............ 327/53 |
| 5,280,452 A | * | 1/1994 | Dhong et al. ................ 365/205 |
| 5,287,314 A | * | 2/1994 | Flannagan et al. .......... 365/208 |
| 5,301,148 A | * | 4/1994 | Okajima et al. ............. 365/177 |
| 5,508,966 A | * | 4/1996 | Nakase ........................ 365/208 |
| 5,577,002 A | * | 11/1996 | Takahashi .................... 365/226 |
| 5,623,437 A | * | 4/1997 | Nogle et al. ................... 365/49 |
| 5,687,127 A | | 11/1997 | Takahashi |
| 6,225,834 B1 | * | 5/2001 | Gang ........................... 327/55 |

* cited by examiner

Primary Examiner—Van Thu Nguyen
Assistant Examiner—Douglas Menz
(74) Attorney, Agent, or Firm—Laurence A. Greenberg; Werner H. Stemer; Ralph E. Locher

(57) ABSTRACT

An evaluation configuration has a first MOS evaluation stage, an isolation stage, and a bipolar evaluation stage. The isolation stage is connected between the first MOS evaluation stage and the bipolar evaluation stage. The isolation stage isolates the first MOS evaluation stage from the bipolar evaluation stage. The evaluation configuration can reliably detect very small read signals and allows a high integration density.

11 Claims, 7 Drawing Sheets

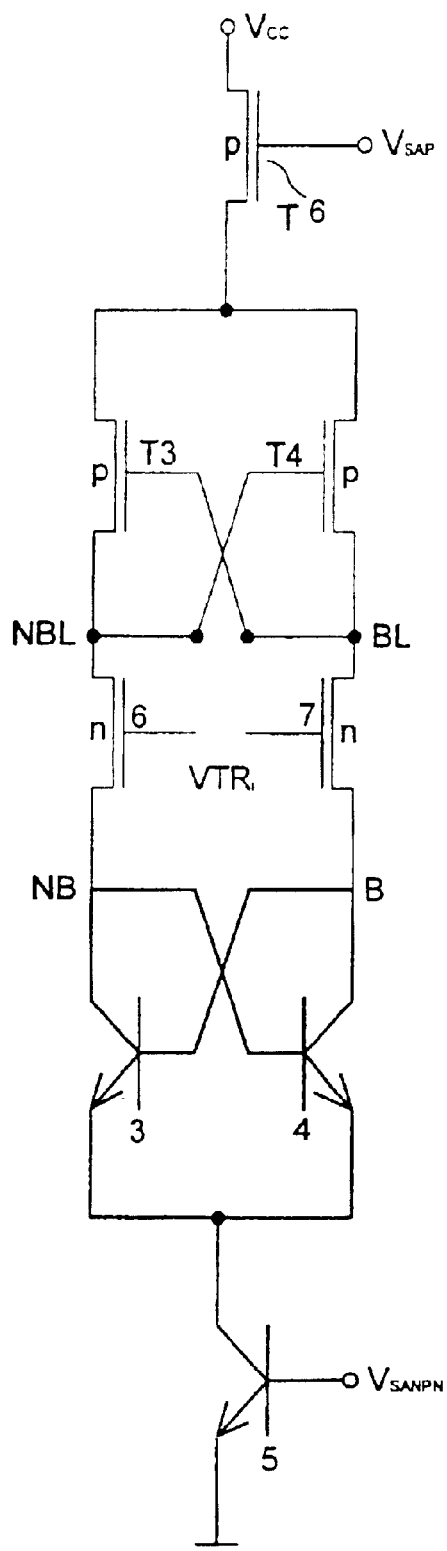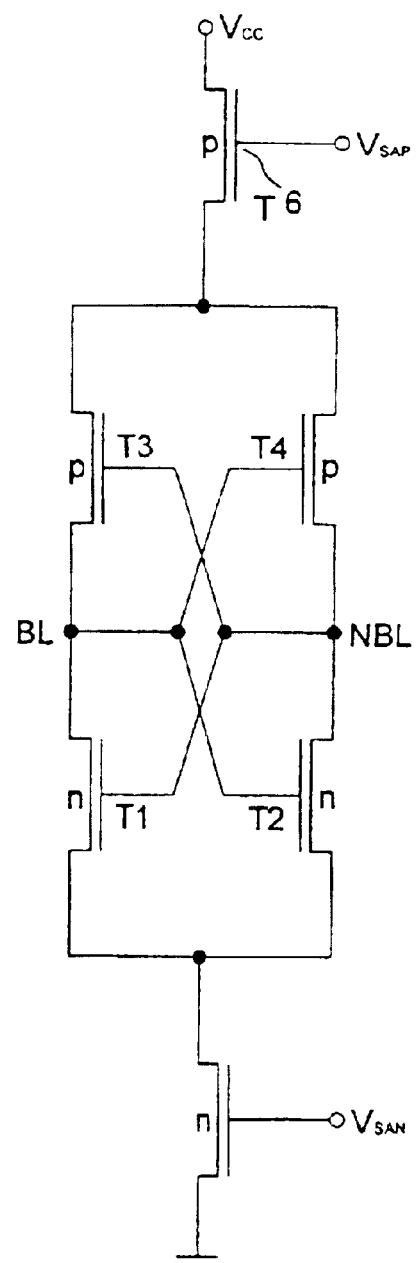
FIG. 1A
FIG. 1B
Prior Art

EVALUATION CONFIGURATION FOR SEMICONDUCTOR MEMORIES

BACKGROUND OF THE INVENTION

Field of the Invention

The present invention relates to an evaluation configuration for a semiconductor memory. Such an evaluation configuration contains, in particular, a first MOS evaluation stage of a first conductivity type with cross-coupled first and second MOS transistors of the first conductivity type, which are connected, by their source-drain paths, in parallel with one another and in series with a third MOS transistor of the first conductivity type. The third MOS transistor is clocked with a first voltage and to which a supply potential is applied.

A preferred semiconductor memory is a dynamic random access memory (DRAM). As is known, a DRAM cell contains a capacitance, in which the cell content is stored, and a MOS selection or isolation transistor. So-called evaluation configurations or sense amplifiers are used to evaluate a read signal read from the capacitance. They are regularly embodied using CMOS technology.

An ideal evaluation configuration should be able to evaluate positive and negative differential signals with arbitrarily small magnitude, provided that the entire circuit configuration of the DRAM including bit lines and reference lines is completely symmetrical. In practice, however, in actual fact small differences in the selection transistors and the bit lines always occur which ultimately cause an offset of the evaluation configuration. The consequence of this is that a read signal must be greater than an off set voltage. In order to be able to identify a cell content reliably as a "1" or "0".

The largest contribution to the offset is supplied by the transistors of the evaluation configuration, this being due to variations from their geometrical dimensions and their electrical parameters. What is problematic, then, is that the variations increase more and more upon the scaling of the transistors. The consequence of this is that the offset voltage of a CMOS evaluation configuration lies between 5 mV and 10 mV and cannot be improved further.

SUMMARY OF THE INVENTION

It is accordingly an object of the invention to provide an evaluation configuration for semiconductor memories which overcomes the above-mentioned disadvantages of the prior art devices of this general type, which can reliably detect very small read signals and allows a high integration density.

With the foregoing and other objects in view there is provided, in accordance with the invention, an evaluation configuration for semiconductor memories. The evaluation configuration contains a first MOS evaluation stage, a second bipolar evaluation stage, and an isolation stage connected between the first MOS evaluation stage and the second bipolar evaluation stage. The isolation stage isolates the second bipolar evaluation stage from the first MOS evaluation stage.

The evaluation configuration according to the invention has, in particular, a second bipolar evaluation stage containing cross-coupled first and second bipolar transistors with base zones of the first conductivity type, which are connected, by their drain-emitter paths, in parallel with one another and in series with the third bipolar transistor. The third bipolar transistor is clocked with a second voltage and to which a reference-ground potential is applied. An isolation stage isolates the second evaluation stage from the first evaluation stage and contains fourth and fifth MOS transistors of a second conductivity type, which are interconnected by their gates. The fourth MOS transistor is connected in series with the first MOS transistor and the first bipolar transistor and the fifth MOS transistor is connected in series with the second MOS transistor and second bipolar transistor. In this case, the first conductivity type is preferably a p-conductivity type.

The evaluation configuration according to the invention thus preferably uses npn bipolar transistors. The latter are distinguished by a high sensitivity, a good gain and a high rapidity for, for example, a supply voltage range that is greater than 0.7 V. The evaluation configuration can evaluate very small read signals. In this case, the sensitivity of the evaluation configuration is about 1 mV, which can be attributed to the fact that the offset voltage of npn bipolar transistors, with about 1 mV, is a factor of 5 to 10 smaller than that of MOS transistors. The layout of the evaluation configuration can readily be integrated easily into a cell array. A simulated evaluation operation lasts approximately 7 ns in the case of a supply voltage of about 1.5 V and approximately 14 ns in the case of a supply voltage of 0.7 V.

The evaluation configuration according to the invention can readily be used in DRAMs, SRAMs and flash EPROMs etc. Its essential advantage is that it can evaluate a significantly smaller read signal compared with previous evaluation configurations. The use of the bipolar transistors makes it possible to overcome the relatively high offset voltage of evaluation configurations using CMOS technology.

Ultimately, in the case of the evaluation configuration according to the invention, the very small read signal is first evaluated and amplified by the second bipolar evaluation stage containing preferably npn bipolar transistors and is then brought to the high level again by the first MOS evaluation stage in a subsequent step, when the read signal has already been amplified to a few hundred mV.

This yields significant advantages. With the preferably npn bipolar transistors, the offset voltage can be lowered to about 1 mV, which is a factor of 5 to 10 times lower than in MOS transistors.

A voltage gain $a_0$ is dependent on the drain-source current $I_{DS}$ in the case of MOS transistors, while the voltage gain $a_0$ is independent of the current and constant in the case of bipolar transistors.

In accordance with an added feature of the invention, the first MOS evaluation stage has a first MOS transistor with a source-drain path and a second MOS transistor with a source drain path. The first MOS transistor is cross-coupled with the second MOS transistor. The source-drain path of the first MOS transistor is disposed in parallel with the source-drain path of the second MOS transistor. A third MOS transistor is disposed in series with the source-drain path of each of the first and second MOS transistors. The third MOS transistor is clocked with a voltage and receives a supply potential.

In accordance with an additional feature of the invention, the first MOS transistor and the second MOS transistor each have a channel of the given (first) conductivity type. The third MOS transistor has a channel of the given (first) conductivity type. The fourth MOS transistor and the fifth MOS transistor have a channel of a further (second) conductivity type.

In accordance with another feature of the invention, the third bipolar transistor has a collector. The first bipolar transistor has a base, a collector, and an emitter connected to the collector of the third bipolar transistor. The second bipolar transistor has a base connected to the collector of the first bipolar transistor, a collector connected to the base of the first bipolar transistor, and an emitter connected to the collector of the third bipolar transistor.

In accordance with a further feature of the invention, there is provided a memory array having a first side and a second side. The first MOS evaluation stage is disposed at the first side of the memory array. The second bipolar evaluation stage and the isolation stage are disposed on the second side of the memory array.

In accordance with a concomitant feature of the invention, the bit lines are connected between the first MOS evaluation stage and the isolation stage.

Other features which are considered as characteristic for the invention are set forth in the appended claims.

Although the invention is illustrated and described herein as embodied in an evaluation configuration for semiconductor memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A is a circuit diagram of an evaluation configuration according to the invention;

FIG. 1B is a circuit diagram of a conventional evaluation configuration;

DESCRIPTION OF THE PREFERRED EMBODIMENTS

Figure 5:
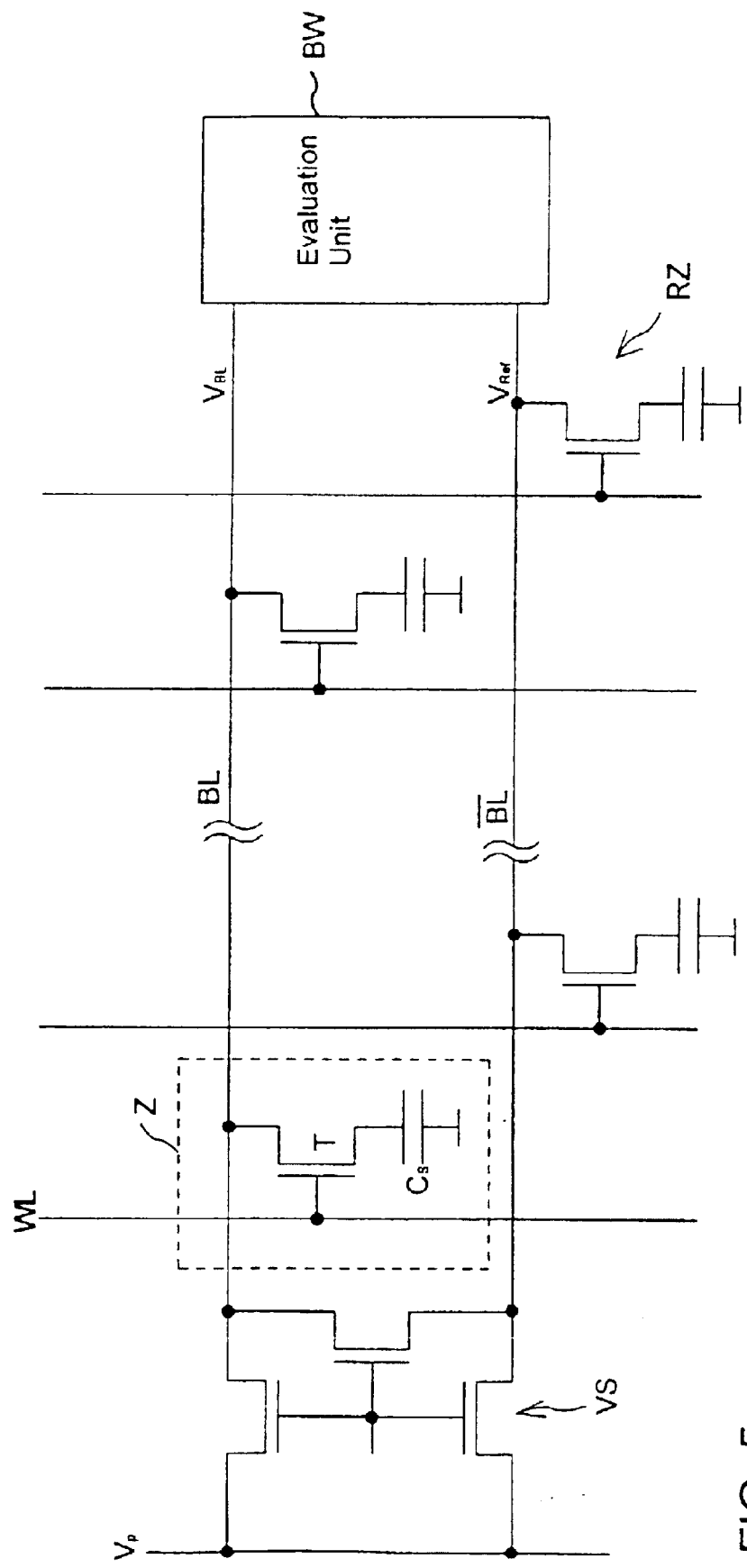
FIG. 5 is a circuit diagram of a cell array according to the prior art.

Referring now to the figures of the drawing in detail and first, particularly, to FIG. 5 thereof, there is shown diagrammatically a detail from a DRAM with a word line WL, bit lines BL, $\overline{BL}$, a memory cell Z containing a storage capacitor $C_S$ and a selection or isolation transistor T, a reference cell RZ and an evaluation configuration or amplifier BW. The bit lines BL, $\overline{BL}$ are precharged to a precharge potential $V_P$ by a precharge circuit VS.

A DRAM is written to and read from by the driving of the selection transistors T via the word line WL. Specifically in the case of reading, charge balancing takes place between the capacitance of the storage capacitor $C_S$ and the parasitic capacitance of the bit line BL as a result of which a read signal $\Delta V_S$ is generated on the bit line BL.

As is known, then, numerous memory cells Z are connected to a bit line. During a read operation, however, only one memory cell thereof is addressed in each case. The bit line itself has a parasitic capacitance caused by the interconnect of the bit line and primarily by the diffusion regions and the overlap capacitances-of the selection transistors connected to it.

Before a read operation, the bit line BL is precharged to a voltage level or the precharge potential $V_P$ by the precharge circuit VS. The charge of the cell Z then effects a voltage change $\Delta V_{BL}$ on the bit line BL during the read operation. The voltage change $\Delta V_{BL}$ is given by:

$$\Delta V_{BL}=(V_S-V_P)C_S/(C_S+C_{BL}))$$

where $C_{BL}$=bit line capacitance; and $V_S$=voltage in the memory cell $C_S$.

A voltage level of 0 V corresponds, for example, to a logic "0" and is designated as a "low level". The supply voltage of DRAMs is intended to lie at $V_{CC}$ (for example 3.3 V). This is then a "high level" corresponding to a logic "1". If the precharge voltage $V_P$ for the bit line BL is chosen as a high level, then a voltage change is obtained only during the reading of a "0". If the bit line BL is at low level, then only a logic "1" generates a signal.

In the case of megabit/gigabit memories in CMOS technology, the so-called "mid level" is often preferred as the precharge voltage $V_P$ of the bit line BL. This level corresponds to half the supply voltage $V_{CC}$. As a result, voltage changes are obtained on the bit line both during the reading of a "1" and during the reading of a "0", which voltage changes are approximately equal in terms of magnitude, but have a different sign. In principle, however, other levels are also possible at the precharge voltage $V_P$.

The capacitance $C_S$ of the memory cell z is significantly smaller than the (parasitic) capacitance of the bit line BL, Generally, a ratio of between 1:7 and 1:15 is present here.

The charge balancing during reading therefore effects a small signal $\Delta V_{BL}$ on the bit line BL, which signal is additionally reduced by disturbances and asymmetries of bit lines, transistors and the evaluation configuration. The information read is evaluated by a comparison of the voltage level $V_{BL}$, generated on the bit line with a reference voltage $V_{ref}$. The read signal $\Delta V_S$ which is passed to the inputs of the evaluation configuration BW, is thus the differential signal:

$$\Delta V_S=V_{BL}-V_{ref}$$

A second bit line with non-selected memory cells is usually used for the generation of the reference signal. This has the advantages that only one evaluation configuration is necessary for two bit lines and the capacitive loads at both amplifier inputs are of approximately the same magnitude. Disturbances which act on both bit lines do not alter the differential signal $\Delta V_S$. The reference bit line acquires a reference voltage level $V_{ref}$ which lies as exactly as possible between the levels which arise during the reading of "0" and "1" on the bit line BL. In the case of the mid-level concept, the precharge voltage $V_{CC}/2$ can be used as the reference. In the case of the high-level or low-level concept, the reference voltage is generated with the aid of so-called reference cells or dummy cells.

Figure 6:
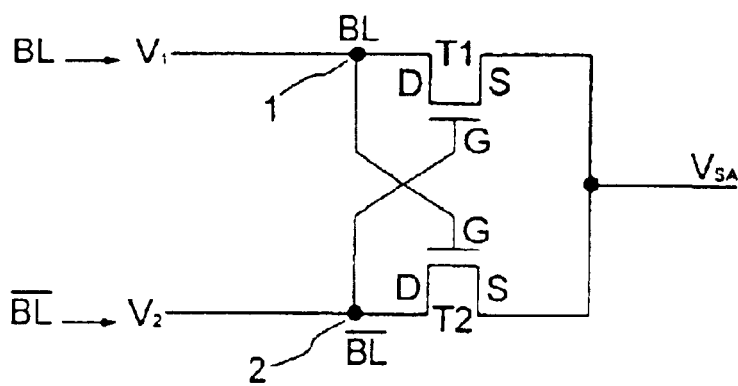
FIG. 6 is a circuit diagram of an existing simple evaluation configuration.

The evaluation configuration must amplify the small differential signal $\Delta V_S$. However, it should contain as few components as possible in order to be able to keep the space requirement as small as possible. Since the evaluation configuration is necessary, then, for each bit line pair, it must be accommodated in the small bit line grid pattern thus prescribed. What has gained acceptance as the best solution hitherto is a circuit that, in the simplest case, only contains two cross-coupled MOS transistors T1, T2 with a source S, a drain D and a gate G, as is shown in FIG. 6. The circuit may be regarded as a "clocked flip-flop" since it toggles into a defined state—under the control of a clock signal $V_{SA}$ present at the sources S of the transistors T1, T2. If the flip-flop is perfectly symmetrical, then the toggling is direction depends only on the sign of the voltage difference $\Delta V_S=(V_1-V_2)$ which is initially present at the two input nodes 1, 2 of the evaluation configuration.

The signal amplification will be explained briefly below using the example of a flip-flop containing n-channel MOS transistors.

Figure 7:
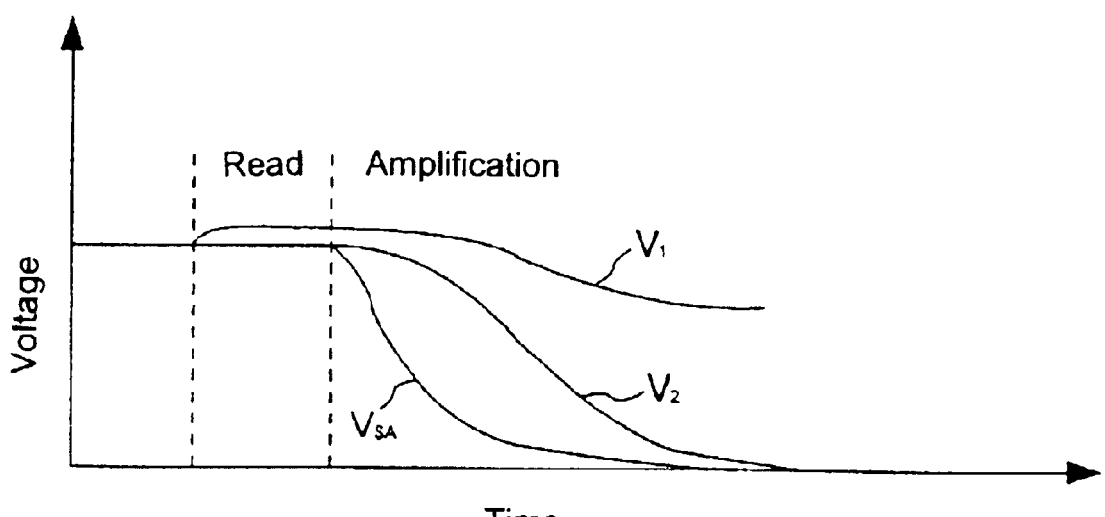
FIG. 7 is a graph showing a voltage profile in the case of the evaluation configuration of FIG. 6.

The profile of voltages $V_1$ and $V_2$ at input nodes 1, 2 is illustrated diagrammatically in FIG. 7. During reading, the common source S of the two cross-coupled transistors T1, T2 has a sufficiently high voltage level of the clock signal $V_{SA}$ to be able to block the two transistors T1, T2. After the read signal has been formed between the two nodes 1, 2, the evaluation configuration BW is activated by the lowering of the clock signal $V_{SA}$, present at the sources S. As a result, the two transistors T1, T2 start to conduct. Assuming that s both transistors T1, T2 have an identical dimensioning and the same parameters, a larger current flows through the transistor with the higher voltage at the gate G. The node connected to the drain D thereof is then discharged more rapidly than the other node, if the capacitive loads of the nodes 1, 2 are identical. The voltage difference $\Delta V_S$ thereby increases. This in turn results in an increasing difference between the currents. Finally, one transistor is still in the on-state, the transistor T2 in the example of FIGS. 6 and 7, which discharges the associated line $\overline{BL}$ to 0 V.

In contrast, the voltage of the other line BL falls only a little overall given a sufficiently high initial signal.

The read operation has a destructive effect for the content of the memory cell. Therefore, the original voltage level must be written back to the memory cell.

A flip-flop containing n-channel MOS transistors (see FIG. 6) generates—as has been explained above—the low level ("0") on one of the two bit lines in order to raise the voltage to a full high level ("1") on the other line, an additional circuit is necessary, for which a p-channel MOS flip-flop with transistors T3, T4 (see FIG. 8) is preferably used, so that CMOS technology can be used. The two transistors T3 and T4 are cross-coupled, like the transistors T1 and T2. A clock signal $V_{SAN}$ is present at the transistors T1, T2, while a clock signal $V_{SAP}$ is applied to the transistors T3, T4.

Figure 8:
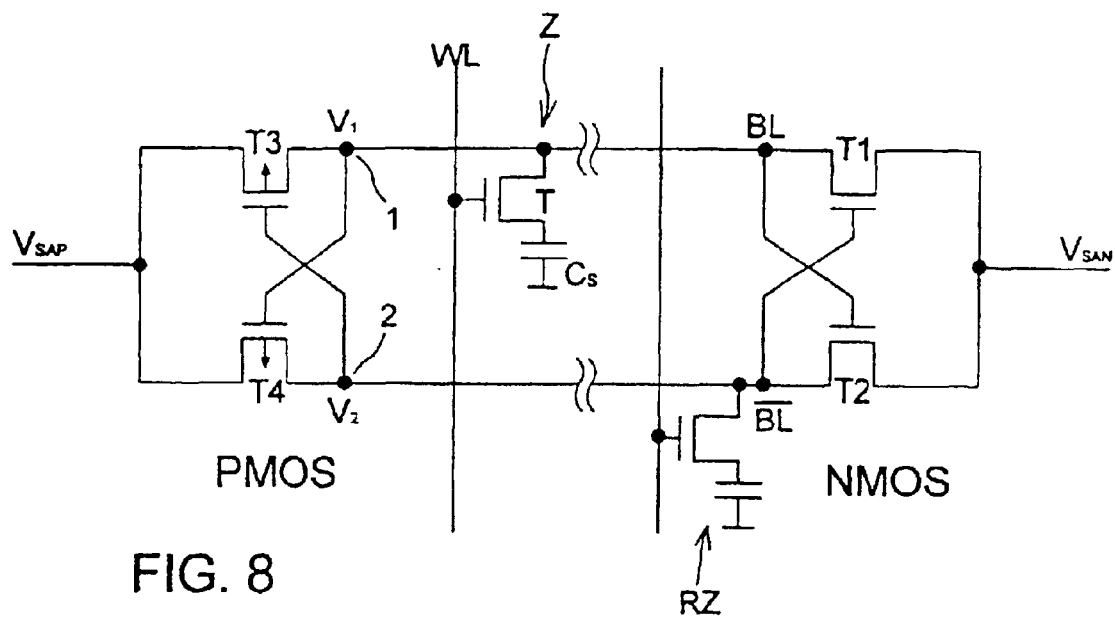
FIG. 8 is a circuit diagram of a CMOS evaluation configuration.
Figure 9:
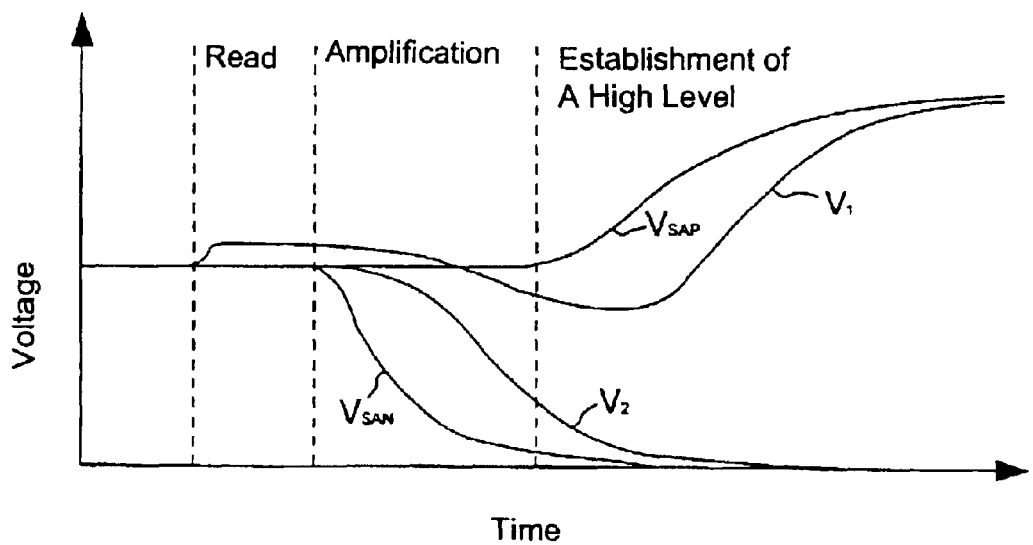
FIG. 9 is a graph of a voltage profile in the case of the evaluation configuration of FIG. 8.

The level of the common sources of the transistors T3, T4 is raised from a low voltage, which ensures that the two transistors T3, T4 are in the off state during reading, to the supply voltage $V_{CC}$ as a result of which the bit line with the higher level, the bit line BL in the example of FIG. 8, is charged to the supply voltage $V_{CC}$, as can be seen from FIG. 9, which illustrates the temporal profile of the voltage at the nodes 1, 2.

After the content has been written back to the memory cell Z, the selection transistor T is switched off, and the bit lines $\overline{BL}$, BL acquire their precharge level, in order to be ready for the next read operation.

In order to ensure that a read signal $\Delta V_S$ is always greater than the offset voltage $\Delta V_O$, which is a prerequisite for a reliable evaluation of the cell content, hitherto the capacitance of the memory cells has been chosen to be so large that the read signal is always greater than the offset voltage of the evaluation configuration. However, this is an obstacle to miniaturization of the DRAM.

Theoretical considerations can be used to show that the variation of the offset voltages is determined by the factor $(U_{GS}-U_{Tn})/2$, which is of the order of magnitude of about 500 mV in the case of MOS transistors, $U_{GS}$ denoting the gate-source voltage and $U_{Tn}$, denoting the threshold voltage of the MOS transistor. In the case of bipolar transistors, the corresponding factor at room temperature has a magnitude of about 26 mV.

Thus, MOS transistors have an offset voltage that is at least one order of magnitude higher than that of bipolar transistors. Added to this is the variation in the threshold voltage $\Delta U_{Tn}$ that is not present, in principle, in the case of bipolar transistors.

If, in the case of MOS transistors, the factor $(U_{GS}-U_{Tn})$ which is also referred to as the so-called "overdrive voltage", were reduced, then a considerable current reduction would occur, which would make the MOS transistor very slow, so that it could no longer satisfy most of the requirements.

In practice, the offset voltage lies in the region of 1 mV in the case of bipolar transistors, while it is of the order of magnitude of 5 mV in the case of MOS transistors.

Moreover, it can be shown that, in the case of a bipolar transistor, the gain $a_0$ thereof is independent of the collector current and thus also of the geometry of the transistor. If the values of the gain $a_o$ of bipolar transistors and MOS transistors are compared, then it is found that the gain $a_0$ is significantly larger in the case of bipolar transistors than in the case of MOS transistors.

FIGS. 1A and 1B illustrate an evaluation configuration according to the invention (FIG. 1A) and a conventional evaluation configuration (FIG. 1B) next to one another. It can be seen from a comparison of FIGS. 1A and 1B that, in the case of the evaluation configuration according to the invention, the n-MOS circuit section with the transistors T1, T2 (FIG. 1B) is completely replaced by a circuit section with two npn bipolar transistors 3, 4 and a switching transistor 5, at which a clock signal $V_{SANPN}$ is present (FIG. 1A).

The evaluation configuration according to the invention is specifically suitable for supply voltages of between about 0.7 V and 1.5 V, since the reestablishment of the high-level signal requires only a minimal outlay in this range. This is because the difference between the high-level signal amplified by the bipolar section of the evaluation configuration and the low-level signal is about 0.7 V.

The bipolar evaluation stage with the transistors 3, 4, is isolated from the MOS evaluation stage with the transistors T3, T4, which are respectively connected to the bit lines BL and NBL, by an isolation stage containing n-channel MOS transistors 6, 7. The isolation stage is necessary in order that the two steps of a read operation, namely the evaluation by the bipolar section of the evaluation configuration and the evaluation by the p-MOS section of the evaluation configuration, can be carried out.

This is because, in order to reestablish the high level, after the evaluation of a read signal by the bipolar evaluation stage, which is deactivated, the cross-coupled p-channel MOS transistors T3, T4 are connected in via the n-channel MOS transistors 6, 7 and activated by the clock signal $V_{SAP}$. Since the read signal has already been amplified to about 700 mV by the bipolar evaluation stage, the sensitivity and the gain of the p-channel MOS transistors T3, T4 are entirely sufficient for reestablishing the high level. In order to be able to avoid parallel-path currents, the MOS evaluation stage with the transistors T3, T4 is isolated from the bipolar evaluation stage by the transistors 6, 7 and activated only after the evaluation by the bipolar evaluation stage.

Figure 2:
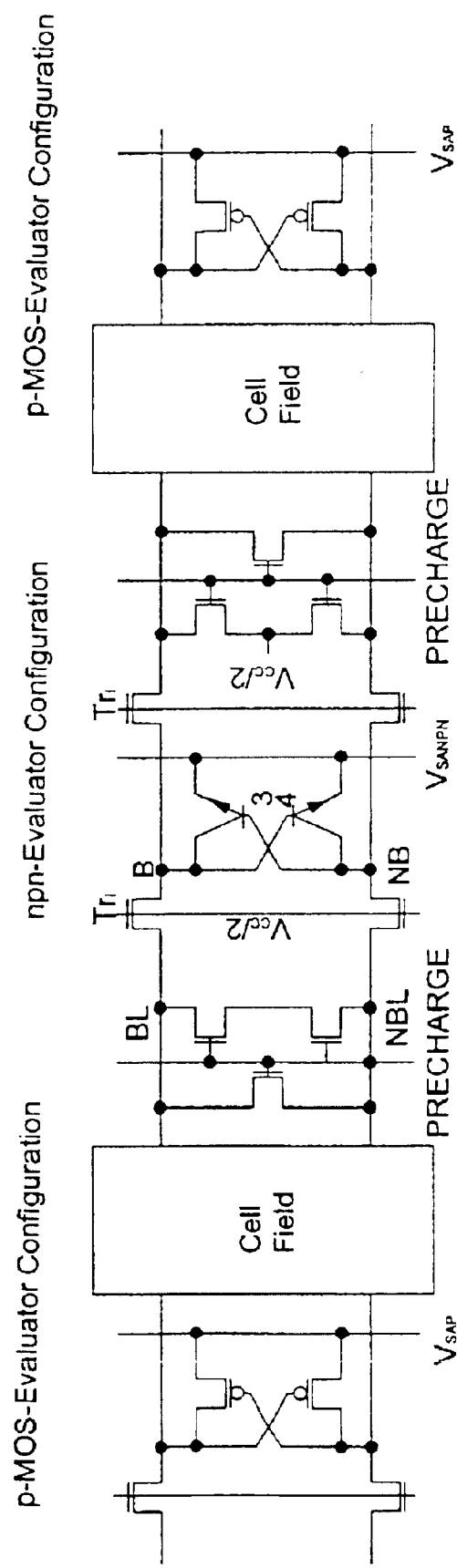
FIG. 2 is an npn evaluation stage and a p-MOS evaluation stage with two cell arrays according to the invention.

The isolation transistors 6, 7 are already present per se for isolating the cell arrays and are concomitantly used; thus, they do not require additional area. The MOS evaluation stages, may be disposed at one of the two sides of each cell arrays as emerges from the diagrammatic illustration of FIG. 2, in which, in addition, the isolation transistors 6, 7 are provided with the reference symbol $Tr_i$ and nodes B, NB are shown. FIG. 2 thus shows a p-MOS evaluation stage at a first cell array, an equalizer for precharging ("Precharge"), an npn evaluation stage, a further equalizer, a further cell array and a p-MOS evaluation stage.

Figure 3:
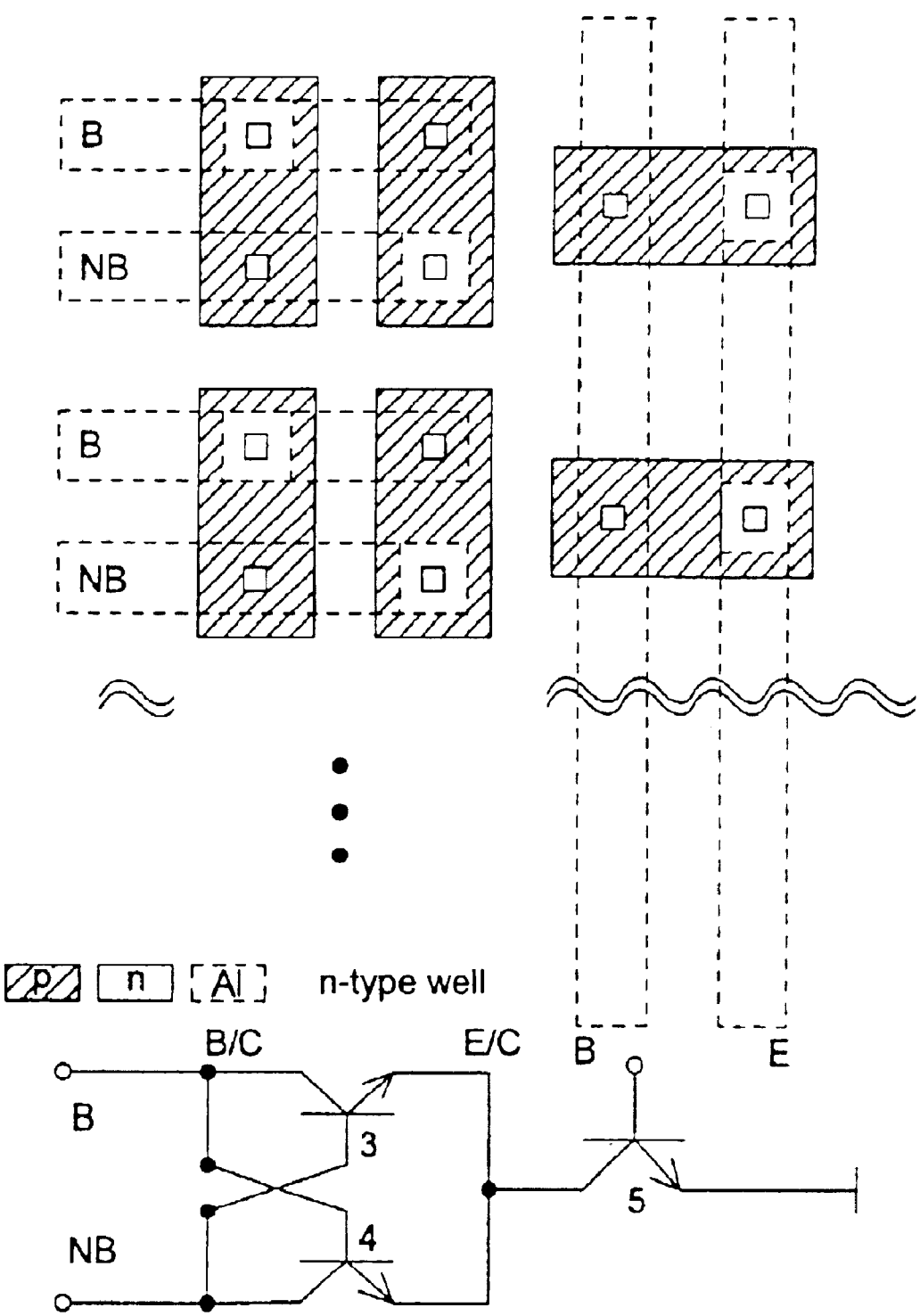
FIG. 3 is a basic layout of the evaluation configuration according to the invention with an npn evaluation stage.

FIG. 3 illustrates a possible layout of the npn evaluation stage for two bit line pairs B, NB. The sizes of the transistors, whose p-conducting regions are shown hatched, are reproduced in relative fashion.

The transposition of the npn transistors can be realized in a very simple manner. In this case, the crossed-over npn transistors operate in the reverse mode, while the npn switching transistor 5 is in the forward mode.

Figure 4:
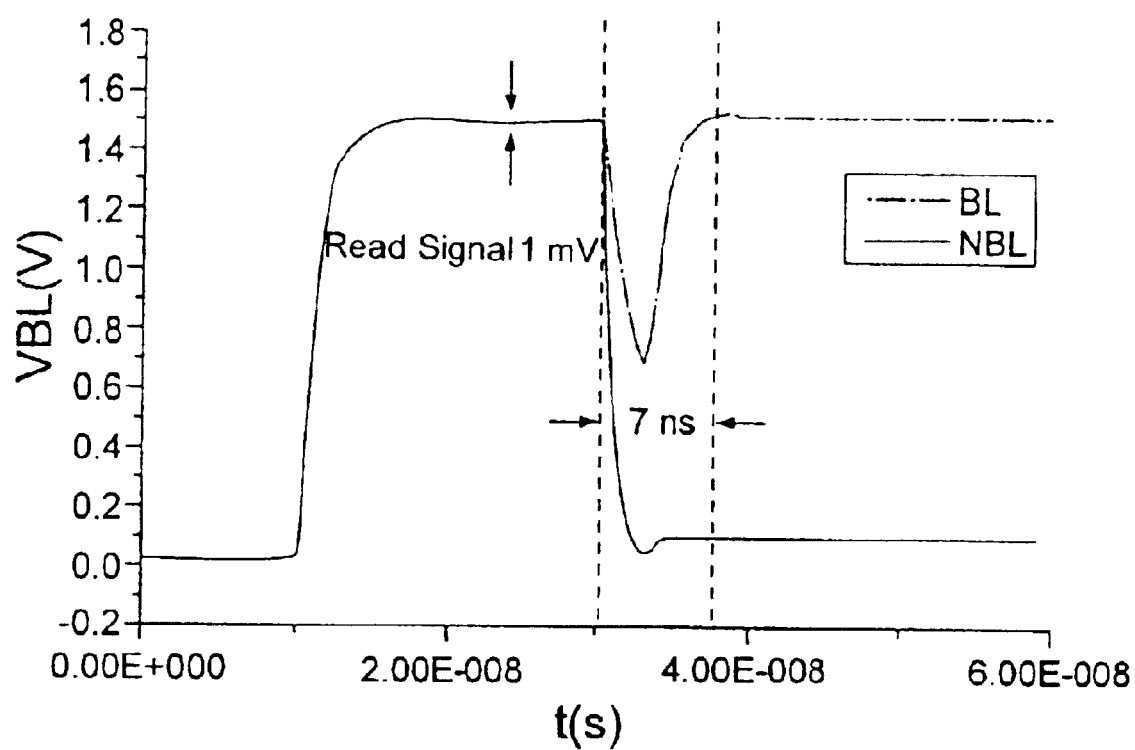
FIG. 4 is a graph showing simulated voltages on bit lines in the case of a read signal of 5 mV for the evaluation configuration according to the invention.

FIG. 4 additionally shows simulation results for an evaluation configuration with a bipolar evaluation stage that corresponds to the example of FIG. 3, it additionally being assumed that the switching transistor 5 has a forward gain of 15 and a reverse gain of 10. Moreover, a bit line capacitance of 500 fF is intended to be present.

It can be gathered, then, from the diagram of FIG. 4, that the evaluation time is about 7 ns in the case of a supply voltage of 1.5 V for a read signal 1 mV, a read current $I_S$ of $10^{-16}$ A being assumed for the bipolar transistors 3 to 5.

The read signal of 1 mV is extremely small but shows the rapidity and performance of the evaluation configuration according to the invention.

An evaluation time of about 14 ns results for a supply voltage of 0.7 V.

By virtue of the fact that the MOS evaluation stage is activated only after the isolation of the isolation transistors $Tr_i$, the low level is raised again by about 60 mV. This is advantageous, however, despite the slight loss of charge in the cell, since the selection transistors of the cell turn off better as a result.

We claim:

1. An evaluation configuration for semiconductor memories, the evaluation configuration comprising:
   a first MOS evaluation stage;
   a second bipolar evaluation stage; and
   an isolation stage connected between said first MOS evaluation stage and said second bipolar evaluation stage, said isolation stage isolating said second bipolar evaluation stage from said first MOS evaluation stage.

2. The evaluation configuration according to claim 1, wherein said first MOS evaluation stage has a first MOS transistor with a source-drain path and a second MOS transistor with a source drain path, said first MOS transistor cross-coupled with said second MOS transistor, said source-drain path of said first MOS transistor disposed in parallel with said source-drain path of said second MOS transistor; and
further comprising a third MOS transistor disposed in series with said source-drain path of each of said first and second MOS transistors, said third MOS transistor being clocked with a voltage and receiving a supply potential.

3. The evaluation configuration according to claim 2, wherein said second bipolar evaluation stage has a first bipolar transistor with a base zone and a drain-emitter path of a given conductivity type, and a second bipolar transistor with a base zone of said given conductivity type and a drain-emitter path, said first bipolar transistor being cross-coupled with said second bipolar transistor, said drain-emitter path of said first bipolar transistor disposed in parallel with said drain-emitter path of said second bipolar transistor; and
further comprising a third bipolar transistor connected in series with said drain-emitter path of each of said first and second bipolar transistors, said third bipolar transistor being clocked with a further voltage and receiving a reference-ground potential.

4. The evaluation configuration according to claim 3, wherein said isolation stage contains a fourth MOS transistor and a fifth MOS transistor each having a gate, said gate of said fourth MOS transistor connected to said gate of said fifth MOS transistor, said fourth MOS transistor connected in series between said first MOS transistor and said first bipolar transistor, said fifth MOS transistor connected in series between said second MOS transistor and said second bipolar transistor.

5. The evaluation configuration according to claim 4, wherein said first MOS transistor and said second MOS transistor each have a channel of said given conductivity type.

6. The evaluation configuration according to claim 4, wherein said third MOS transistor has a channel of said given conductivity type.

7. The evaluation configuration according to claim 4, wherein said fourth MOS transistor and said fifth MOS transistor have a channel of a further conductivity type.

8. The evaluation configuration according to claim 4, wherein said given conductivity type is a p-conductivity type.

9. The evaluation configuration according to claim 4, wherein:
   said third bipolar transistor has a collector;
   said first bipolar transistor has a base, a collector, and an emitter connected to said collector of said third bipolar transistor; and
   said second bipolar transistor has a base connected to said collector of said first bipolar transistor, a collector connected to said base of said first bipolar transistor, and an emitter connected to said collector of said third bipolar transistor.

10. The evaluation configuration according to claim 1, further comprising a memory array having a first side and a second side, and first MOS evaluation stage disposed at said first side of said memory array, said second bipolar evaluation stage and said isolation stage disposed on said second side of said memory array.

11. The evaluation configuration according to claim 1, further comprising bit lines connected between said first MOS evaluation stage and said isolation stage.

* * * * *